US012626962B2

(12) United States Patent
Cheng et al.

(10) Patent No.: US 12,626,962 B2
(45) Date of Patent: May 12, 2026

(54) BATTERY TEST APPARATUS

(71) Applicant: Contemporary Amperex Technology (Hong Kong) Limited, Hong Kong (CN)

(72) Inventors: Jiawu Cheng, Ningde (CN); Xueqing Gong, Ningde (CN); Guangwei Zhou, Ningde (CN); Muqing He, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 123 days.

(21) Appl. No.: 18/518,775

(22) Filed: Nov. 24, 2023

(65) Prior Publication Data

US 2024/0429473 A1 Dec. 26, 2024

Related U.S. Application Data

(63) Continuation of application No. PCT/CN2023/101901, filed on Jun. 21, 2023.

(51) Int. Cl.
*H01M 10/42* (2006.01)
*G01R 1/073* (2006.01)
*G01R 31/374* (2019.01)

(52) U.S. Cl.
CPC ........ *H01M 10/4285* (2013.01); *G01R 1/073* (2013.01); *G01R 31/374* (2019.01)

(58) Field of Classification Search
None
See application file for complete search history.

(56) References Cited

U.S. PATENT DOCUMENTS

| | | | | |
|---|---|---|---|---|
| 4,818,933 A * | 4/1989 | Kerschner | ................ | G01R 1/04 |
| | | | | 324/750.16 |
| 7,053,639 B1 * | 5/2006 | Fyfield | ................ | G01R 31/311 |
| | | | | 324/755.07 |
| 9,459,279 B2 * | 10/2016 | Ku | ................ | G01R 1/04 |
| 11,674,979 B2 * | 6/2023 | Howard | ............ | G01R 31/2868 |
| | | | | 324/754.03 |
| 2022/0365038 A1 * | 11/2022 | Ma | ........................ | G01N 29/265 |
| 2025/0123307 A1 * | 4/2025 | Xie | ........................ | G01R 31/378 |

FOREIGN PATENT DOCUMENTS

| | | | | |
|---|---|---|---|---|
| CN | 102117589 A | | 7/2011 | |
| CN | 103257321 A | * | 8/2013 | |
| CN | 212622987 U | | 2/2021 | |
| CN | 114062738 A | * | 2/2022 | ......... G01R 1/07307 |

(Continued)

OTHER PUBLICATIONS

English Translation—CN 114594294 A (Year: 2022).*

(Continued)

*Primary Examiner* — Richard Isla
(74) *Attorney, Agent, or Firm* — ANOVA LAW GROUP, PLLC

(57) ABSTRACT

A battery test apparatus includes a lifting mechanism and a probe mechanism. The lifting mechanism is configured to drive the probe mechanism to move. The probe mechanism includes an adapting rack and a plurality of first connecting members disposed on the adapting rack. The adapting rack is detachably connected to the lifting mechanism.

14 Claims, 10 Drawing Sheets

(56) References Cited

FOREIGN PATENT DOCUMENTS

| CN | 114200265 | A | | 3/2022 | |
|----|-----------|---|---|--------|---|
| CN | 114252796 | A | | 3/2022 | |
| CN | 114594294 | A | * | 6/2022 | ........... F16M 11/046 |
| CN | 115032539 | A | | 9/2022 | |
| CN | 115166436 | A | | 10/2022 | |
| CN | 115201701 | A | | 10/2022 | |
| CN | 115291119 | A | | 11/2022 | |
| CN | 218433665 | U | | 2/2023 | |
| JP | 2013149440 | A | | 8/2013 | |

OTHER PUBLICATIONS

CN-114062738-A—English Translation (Year: 2022).*
CN-103257321-A—English Translation (Year: 2013).*
The World Intellectual Property Organization (WIPO) International Search Report for PCT/CN2023/101901 Mar. 15, 2024 6 Pages (including translation).
The European Patent Office (EPO) The Extended European Search Report for Application No. 23810276.8 Nov. 6, 2024 7 Pages.

* cited by examiner

BATTERY TEST APPARATUS

CROSS-REFERENCE TO RELATED APPLICATION

This application International Application is a continuation of No. PCT/CN2023/101901, filed on Jun. 21, 2023, the entire content of which is incorporated herein by reference.

TECHNICAL FIELD

This application relates to the field of battery technologies and specifically to a battery test apparatus.

BACKGROUND

Currently, the insulativity, voltage resistance, and the like of a battery are primarily tested using a battery test apparatus. A battery test apparatus includes a lifting mechanism and a probe mechanism. The probe mechanism is fixedly connected to the lifting mechanism. The probe mechanism includes a plurality of probes. Distance between the probes matches distance between electrode terminals of battery cells in the battery. The distance between the electrode terminals is determined based on the size of the battery cells. The lifting mechanism can push the probe mechanism to a position close to the battery, allowing the probes to contact with the electrode terminals of the battery cells for testing the battery.

To ensure accurate and reliable contact between the probes and the electrode terminals, the plurality of probes are typically fixedly mounted to the lifting mechanism, allowing for a fixed distance between the probes. When the size of the battery cells changes, there is a need to adjust the distance between the probes, such that the distance between the probes can match the distance between the electrode terminals.

During adjustment of the distance between the probes, since there are a large number of probes that are all fixedly mounted to the lifting mechanism, it may take a long time to adjust the distance between the probes, making the battery test apparatus possibly unable to quickly adapt to batteries formed by battery cells of different sizes, thereby reducing the test efficiency of the battery test apparatus.

SUMMARY

Embodiments of this application are intended to provide a battery test apparatus, so as to resolve problems including but not limited to low test efficiency of battery test apparatuses in the related art because the battery test apparatuses cannot quickly adapt to batteries formed by battery cells of different sizes.

An embodiment of this application provides a battery test apparatus including a lifting mechanism and a probe mechanism. The lifting mechanism is configured to drive the probe mechanism to move. The probe mechanism includes an adapting rack and a plurality of first connecting members disposed on the adapting rack. The adapting rack is detachably connected to the lifting mechanism.

The probe mechanism is detachably connected to the lifting mechanism via the adapting rack. When the size of a battery cell changes and distance between probes needs to be adjusted, the adapting rack and the lifting mechanism can be separated first, and the probe mechanism is taken out of the battery test apparatus so that the distance between the probes is adjusted outside the battery test apparatus, reducing operation difficulty and improving adjustment efficiency, thereby shortening the time for adjusting the distance between the probes. As a result, the battery test apparatus can quickly adapt to batteries formed by battery cells of different sizes, thereby improving the test efficiency of the battery test apparatus.

Alternatively, a standby probe mechanism may be provided. When the size of the battery cells changes, the adapting rack and the lifting mechanism can be separated, and the entire probe mechanism is directly replaced to implement quick model replacement so as to adapt to battery cells of different models, thereby improving the test efficiency.

In some embodiments, the adapting rack is detachably connected to the lifting mechanism on one side and provided with two opposite first connecting portions on another side. The plurality of first connecting members are mounted between the two first connecting portions.

In these embodiments of this application, the adapting rack is provided with the two opposite first connecting portions, and a plurality of first probes may be mounted between the two first connecting portions, so that the entire probe mechanism has a simple structure and a large operation space, allowing an operator to conveniently adjust or maintain the first probes between the two first connecting portions.

In some embodiments, the probe mechanism includes a first guide rail; two ends of the first guide rail are connected to the two first connecting portions respectively; and the plurality of first probes are mounted to the first guide rail.

In these embodiments of this application, the plurality of first probes being mounted to the first guide rail between the two first connecting portions can simplify the structure of the probe mechanism and reduce the weight of the probe mechanism, allowing an operator to conveniently dismount the probe mechanism.

In some embodiments, the probe mechanism includes a plurality of first guide rails arranged in parallel, with an adjustable distance between adjacent two of the first guide rails.

In these embodiments of this application, the probe mechanism includes the plurality of first guide rails arranged in parallel, with an adjustable distance between adjacent two of the first guide rails; and the first probes mounted to the plurality of first guide rails may come into contact with multiple rows of electrode terminals in a battery, such that the probe mechanism can come into contact with the multiple rows of electrode terminals in the battery and adapt to batteries formed by battery cells different in width.

In some embodiments, the first connecting portion is provided with a second guide rail, and the first guide rail is slidably connected to the first connecting portion via the second guide rail.

In these embodiments of this application, the probe mechanism includes the second guide rails, and distance between the first guide rails can be adjusted via the second guide rails, such that the probe mechanism can adapt to battery cells of different sizes, allowing for relatively high compatibility of the battery test apparatus.

In some embodiments, the probe mechanism further includes a plurality of first connecting members; the plurality of first connecting members are connected to the first guide rail; and the plurality of first probes are mounted to the first guide rail via the plurality of first connecting members.

In these embodiments of this application, the first probes are mounted to the first guide rail via the plurality of first connecting members, allowing for convenient adjustment of the distance between the first probes.

In some embodiments, the first connecting member is provided with a second connecting portion; and the first guide rail is provided with a first slide way matching the second connecting portion; where the second connecting portion is slidably connected to the first slide way.

In these embodiments, the first connecting member is slidably connected to the first slide way on the first guide rail via the second connecting portion, so that an operator can conveniently adjust distance between two adjacent first connecting members on the first guide rail, shortening the time for adjusting the distance between the first probes, thereby improving the test efficiency of the battery test apparatus.

In some embodiments, the lifting mechanism is provided with a plurality of first plug-connection members spaced apart along a length direction of the first guide rail. The adapting rack is provided with second plug-connection members corresponding to the first plug-connection members, and the second plug-connection members are in plug connection with the corresponding first plug-connection members.

In these embodiments of this application, the probe mechanism and the lifting mechanism are detachably connected via plug-connection fit between the second plug-connection members and the first plug-connection members, so that an operator can conveniently dismount and mount the probe mechanism, improving the dismounting and mounting efficiency for the probe mechanism, thereby improving the test efficiency of the battery test apparatus.

In some embodiments, the first plug-connection member is provided with a first in-place detection sensor, and the first in-place detection sensor is configured to detect whether the second plug-connection member is inserted in place.

In these embodiments of this application, the first plug-connection member is provided with the in-place detection sensor, allowing the battery test apparatus to conveniently acquire a mounting state of the probe mechanism and effectively test a battery according to the mounting state of the probe mechanism.

In some embodiments, the first plug-connection member is provided with a first fixing member, and the first fixing member is configured to fix the second plug-connection member to the first plug-connection member.

In these embodiments of this application, the first plug-connection member is provided with the fixing member, and the fixing member is capable of fixing the second plug-connection member such that the probe mechanism is stably mounted to the lifting mechanism, improving the stability of the probe mechanism, thereby improving the accuracy of a test result.

In some embodiments, the probe mechanism further includes a first electrical connector and a second electrical connector. The plurality of first probes are electrically connected to the first electrical connector, the second electrical connector is electrically connected to a circuit in the battery test apparatus, and the first electrical connector is electrically connected to the second electrical connector.

In these embodiments of this application, with plug-connection fit between the first electrical connector and the second electrical connector, the probe mechanism and the battery test apparatus can be electrically connected or disconnected quickly, thereby significantly shortening the time for dismounting and mounting the probe mechanism.

In some embodiments, the plurality of first connecting members are detachably connected to the first guide rail; the first connecting member is provided with a first joint; the first joint is electrically connected to the first probe mounted to the first connecting member; and the battery test apparatus includes second joints corresponding to the first joints, the second joints are detachably connected to the corresponding first joints, and the second joints are electrically connected to the circuit in the battery test apparatus.

In these embodiments of this application, the first connecting member is detachably connected to the first guide rail, and the first probe and the circuit are electrically connected via the first joint and the second joint that are detachably connected, such that in case of a fault occurring in the first connecting member, the first connecting member with the fault can be quickly replaced, allowing an operator to conveniently maintain the probe mechanism.

In some embodiments, at least some of the first connecting members are provided with a temperature sensor, and the temperature sensor is configured to detect temperature of a battery cell.

In these embodiments of this application, some of the first connecting members are provided with a temperature sensor, and the temperature of the battery cells in the battery can be detected using the temperature sensors, allowing for convenient temperature detection for characteristic points of the battery during a battery test.

In some embodiments, at least some of the first connecting members are provided with a second in-place detection sensor, and the second in-place detection sensor is configured to detect whether the probe mechanism has moved to a target position.

In these embodiments of this application, some of the first connecting members are provided with an in-place detection sensor, and the position of the probe mechanism can be detected using the in-place detection sensors, reducing possibility of hard contact between the probe mechanism and a battery, thereby effectively protecting the probe mechanism.

In some embodiments, the probe mechanism further includes a second connecting member mounted to the first connecting portion, and a second probe on the second connecting member is configured to contact with an end plate of a battery.

In these embodiments of this application, when the probe mechanism includes the second probe, the battery test apparatus can perform an insulation test on the battery, expanding the application range of the battery test apparatus.

In some embodiments, the battery test apparatus further includes support mechanisms parallel to the probe mechanism, and the support mechanisms are configured to support the probe mechanism when the probe mechanism is separated from the lifting mechanism.

In these embodiments of this application, a support member is mounted in the battery test apparatus to reduce the dismounting and mounting difficulty of the probe mechanism and implement quick mounting and dismounting of the probe mechanism, thereby improving the test efficiency of the battery test apparatus.

BRIEF DESCRIPTION OF DRAWINGS

To describe the technical solutions in the embodiments of this application more clearly, the following briefly describes the accompanying drawings required for the embodiments or demonstrative technical description. Apparently, the accompanying drawings in the following description show merely some embodiments of this application, and persons of ordinary skill in the art may still derive other drawings from these accompanying drawings without creative efforts.

REFERENCE SIGNS

Figure 1:
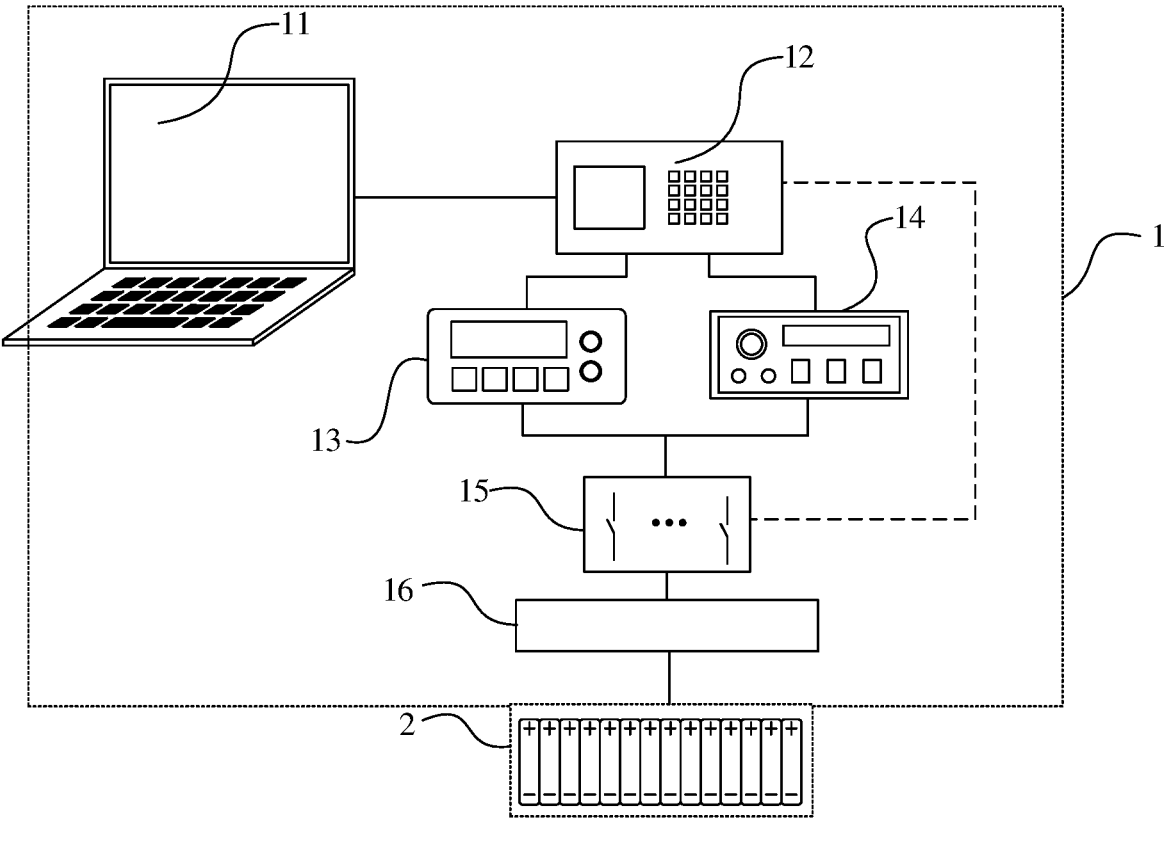
FIG. 1 is a schematic diagram of a test scenario for a battery according to some embodiments of this application.

1. battery test apparatus; 11. principle computer; 12. controller; 13. universal meter; 14. withstand voltage tester; 15. circuit; 16. probe mechanism; 2. battery; 31. frame; 32. lifting mechanism; 321. first plug-connection member; 3211. first handle; 3212. first fixing member; 3213. first in-place detection sensor; 3214. limiting member; 322. mounting plate; 323. movable plate; 324. servo motor; 325. linear bearing; 326. connecting plate; 327. balance cylinder; 328. tank chain; 33. probe mechanism; 331. first probe; 332. adapting rack; 333. first connecting portion; 334. first guide rail; 3341. first slide way; 335. second guide rail; 336. second plug-connection member; 337. first electrical connector; 338. second electrical connector; 339. first connecting member; 3391. first bent portion; 3392. second bent portion; 3393. second connecting portion; 3394. screw hole; 3310. first joint; 3311. second joint; 3312. temperature sensor; 3313. second in-place detection sensor; 33131. trigger probe; 33132. sensing component; 3314. second connecting member; 3315. second fixing member; 3316. second slide way; 3317. second handle; 3318. structural member; 3319. second probe; 34. first accommodating space; 35. second accommodating space; 36. tray; 37. support mechanism; 371. unpowered roller; 372. mounting rail; 38. safety cross beam; 39. safety grating; and 310. safety switch.

DESCRIPTION OF EMBODIMENTS

The following describes in detail the embodiments of technical solutions of this application with reference to the accompanying drawings. The following embodiments are merely intended for a clearer description of the technical solutions of this application and therefore are merely used as examples which do not constitute any limitation on the protection scope of this application.

Unless otherwise defined, all technical and scientific terms used herein shall have the same meanings as commonly understood by persons skilled in the art to which this application pertains. The terms used herein are intended to merely describe the specific embodiments rather than to limit this application. The terms "include", "comprise", and any other variations thereof in the specification, claims and brief description of drawings of this application are intended to cover non-exclusive inclusions.

In the description of the embodiments of this application, the technical terms "first", "second", and the like are merely intended to distinguish between different objects, and shall not be understood as any indication or implication of relative importance or any implicit indication of the number, particular sequence or primary-secondary relationship of the technical features indicated. In the description of this application, "a plurality of" means at least two unless otherwise specifically stated.

In this specification, reference to "embodiment" means that specific features, structures, or characteristics described with reference to the embodiment may be incorporated in at least one embodiment of this application. The word "embodiment" appearing in various places in the specification does not necessarily refer to the same embodiment or an independent or alternative embodiment that is exclusive of other embodiments. It is explicitly or implicitly understood by persons skilled in the art that the embodiments described herein may be combined with other embodiments.

In the description of the embodiments of this application, the term "and/or" is only an associative relationship for describing associated objects, indicating that three relationships may be present. For example, A and/or B may indicate the following three cases: presence of only A, presence of both A and B, and presence of only B. In addition, the character "/" in this specification generally indicates an "or" relationship between contextually associated objects.

The insulativity, voltage resistance, and the like of a battery determine whether the battery can operate safely and reliably. Therefore, during a battery manufacturing process, there is a need to test the insulativity, voltage resistance, and the like of the battery. A battery is also referred to as a battery pack (pack) and may be formed by a plurality of battery cells connected in series and/or in parallel or formed by a plurality of battery modules (battery module) connected in series and/or in parallel. Each battery module is formed by a plurality of battery cells (also referred to as cells) connected in series and/or in parallel.

Currently, the insulativity, voltage resistance, and the like of a battery are primarily tested using a battery test apparatus. A battery test apparatus includes a lifting mechanism and a probe mechanism, as well as a controller, a circuit, a withstand voltage tester, a universal meter, and the like, but is not limited thereto.

During a test, the lifting mechanism can drive the probe mechanism to move up and down so that the probe mechanism is pushed to a position close to a battery, allowing probes in the probe mechanism to contact with electrode terminals of a battery cell in the battery. After the test, the lifting mechanism can drive the probe mechanism to move up and down again, such that the probes are separated from the electrode terminals.

The probes in the probe mechanism are electrically connected to relays in a circuit. After contact connection is established between the probes and the electrode terminals, the controller can control each relay in the circuit to be in an on or off state, such that the battery cells in the battery are connected in series and/or in parallel, the battery cells connected in series and/or in parallel are connected to the withstand voltage tester or universal meter, and the battery undergoes a voltage withstand test or an insulation test using the withstand voltage tester or universal meter.

Distance between two adjacent probes in the probe mechanism corresponds to distance between the electrode terminals of two adjacent battery cells in the battery. During the test, to ensure that the probes can come into accurate and reliable contact with the electrode terminals so as to ensure the accuracy of a test result, all the probes are fixedly mounted on the probe mechanism, such that the distance between the probes is fixed, allowing the battery test apparatus to accurately test batteries formed by battery cells of a specified size.

When the size of the battery cells changes, the distance between the electrode terminals of two adjacent battery cells changes. Therefore, the distance between the probes needs to be adjusted to ensure that the distance between the probes matches the distance between the electrode terminals in the battery, such that the probes can come into accurate contact with the electrode terminals.

The probe mechanism is typically located inside the battery test apparatus, inconvenient for direct operation of an operator, and making it difficult to adjust the distance between the probes. Moreover, all the probes are fixedly connected to the lifting mechanism, and there are a large number of probes. Therefore, it takes a long time to adjust the distance between the probes, making the battery test apparatus possibly unable to quickly adapt to batteries formed by battery cells of different sizes, thereby reducing the test efficiency of the battery test apparatus.

To resolve the foregoing technical problems, an embodiment of this application provides a battery test apparatus including a lifting mechanism and a probe mechanism. The lifting mechanism is configured to drive the probe mechanism to move. The probe mechanism includes an adapting rack and a plurality of first connecting members disposed on the adapting rack. The adapting rack is detachably connected to the lifting mechanism.

In this embodiment of this application, the probe mechanism is detachably connected to the lifting mechanism via the adapting rack. When the size of the battery cells changes and the distance between the probes needs to be adjusted, the adapting rack and the lifting mechanism can be separated first, and the probe mechanism is taken out of the battery test apparatus so that the distance between the probes is adjusted outside the battery test apparatus, reducing operation difficulty and improving adjustment efficiency, thereby shortening the time for adjusting the distance between the probes. As a result, the battery test apparatus can quickly adapt to batteries formed by battery cells of different sizes, thereby improving the test efficiency of the battery test apparatus.

Alternatively, a standby probe mechanism may be provided. When the size of the battery cells changes, the adapting rack and the lifting mechanism can be separated, and the entire probe mechanism is directly replaced to implement quick model replacement so as to adapt to battery cells of different models, thereby improving the test efficiency.

The size of the battery cells generally corresponds to the model. The battery cells of different models are usually different in size. The battery test apparatus can quickly adapt to a battery formed by battery cells of different sizes.

Therefore, the battery test apparatus can implement quick switch between batteries formed by battery cells of different models, such that the battery test apparatus can quickly and flexibly adapt to the batteries formed by battery cells of different models.

FIG. 1 is a schematic diagram of a test scenario for a battery according to some embodiments of this application. As shown in FIG. 1, a battery test apparatus 1 includes a principle computer 11, a controller 12, a universal meter 13, a withstand voltage tester 14, a circuit 15, a probe mechanism 16, and the like. The principle computer 11 may be a computer, a notebook computer, an industrial personal computer, or the like. The controller 12 may be, for example, a programmable logic controller (programmable logic controller, PLC), but is not limited thereto.

Probes in the probe mechanism 16 may come into contact with electrode terminals in a battery cell included in a battery 2 so as to be electrically connected to the electrode terminals. The circuit 15 includes a plurality of relays. The plurality of relays are connected in series and/or in parallel. The plurality of probes in the probe mechanism 16 are respectively connected to different relays in the circuit 15. In addition, some of the relays in the circuit 15 are electrically connected to the universal meter 13 and the withstand voltage tester 14.

The controller 12 is electrically connected to each relay in the circuit 15 and can control the relay to be in an on or off state. During a test of the battery 2, after the probes in the probe mechanism 16 come into contact with the electrode terminals of the battery cells in the battery 2, the controller 12 can control the relays in the circuit 15 to be on or off, such that the battery cells in the battery 2 are connected in series and/or in parallel, the battery cells connected in series and/or in parallel are connected to the universal meter 13 or the withstand voltage tester 14, and then the withstand voltage tester 14 is started to perform a voltage withstand test on the battery or the universal meter 13 is started to perform an insulation test on the battery.

The foregoing is merely an illustrative example, and specific composition of the battery test apparatus may include but are not limited to the foregoing example.

Figure 2:
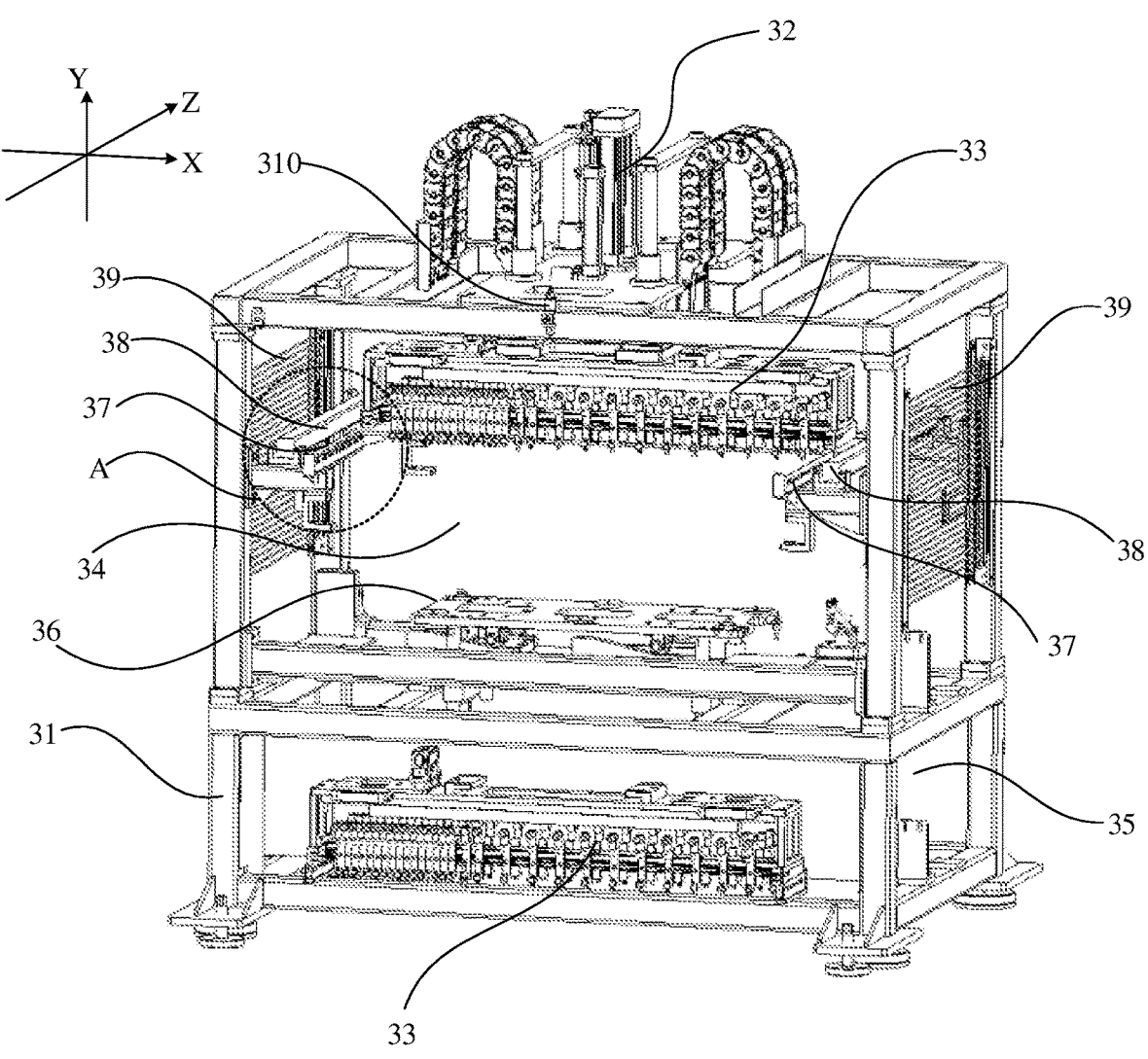
FIG. 2 is a schematic diagram of a partial structure of a battery test apparatus according to some embodiments of this application.

FIG. 2 is a schematic diagram of a partial structure of a battery test apparatus according to some embodiments of this application. As shown in FIG. 2, the battery test apparatus includes a frame 31, a lifting mechanism 32, and a probe mechanism 33.

For example, the frame 31 may be a frame structure formed by assembling a plurality of cross beams and a plurality of uprights; and the frame 31 is provided with a first accommodating space 34 in an upper portion and a second accommodating space 35 in a lower portion. The probe mechanism 33 is mounted in an upper portion of the first accommodating space 34, and a tray 36 for holding a battery is disposed in a lower portion of the first accommodating space 34. The second accommodating space 35 is configured to place standby components, for example, a standby probe mechanism 33. The lifting mechanism 32 is mounted on the top of the frame 31, and a movable end of the lifting mechanism 32 extends into the first accommodating space 34 and is connected to the probe mechanism 33.

Direction Y is a vertical direction, direction X is a horizontal direction perpendicular to direction Y, and direction Z is another horizontal direction perpendicular to direction X. The top, the upper portion, and the lower portion refer to relative region division in direction Y.

The lifting mechanism 32 can drive the probe mechanism 33 to move up and down along direction Y, so that probes in the probe mechanism 33 come into contact with or leave electrode terminals of battery cells in a battery. After the probe mechanism 33 has moved to a position close to the battery placed on the tray 36, the probes in the probe mechanism 33 come into contact with the electrode terminals in the battery, allowing the battery to be tested.

Figure 3:
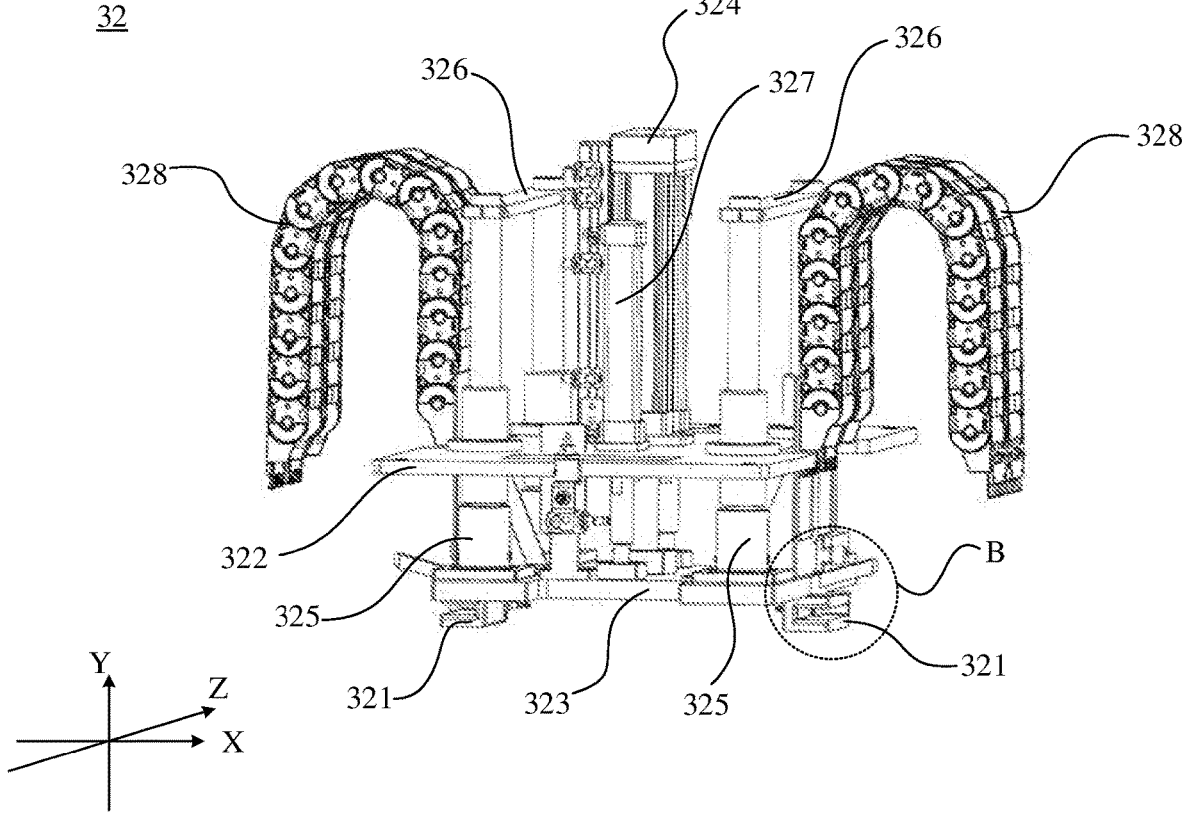
FIG. 3 is a schematic structural diagram of a lifting mechanism according to some embodiments of this application.

FIG. 3 is a schematic structural diagram of a lifting mechanism according to some embodiments of this application. As shown in FIG. 3, the lifting mechanism 32 includes a mounting plate 322, and the mounting plate 322 is fixedly connected to a cross beam at the top of the frame 31, so that the entire lifting mechanism 32 can be fixed to the top of the frame 31. The lifting mechanism 32 further includes a movable plate 323. The movable plate 323 forms a movable end of the lifting mechanism 32. The movable plate 323 is located in the first accommodating space 34 and can be connected to the probe mechanism 33 to drive the probe mechanism 33 to move up and down along direction Y.

For example, a driving member in the lifting mechanism 32 is a servo motor 324 shown in FIG. 3; the servo motor 324 is fixedly mounted to the mounting plate 322; and a movable end of the servo motor 324 is connected to the movable plate 323. The mounting plate 322 is further provided with a plurality of linear bearings 325 spaced apart from each other. The linear bearings 325 are fixedly connected via a connecting plate 326, and movable ends of the linear bearings 325 are connected to the movable plate 323. During operation of the servo motor 324, under the action of the linear bearings 325, the movable plate 323 can be driven to move in a straight line along direction Y, so as to drive the probe mechanism 33 to move up and down along direction Y.

The mounting plate 322 is further provided with a plurality of balance cylinders 327 spaced apart from each other. For example, two balance cylinders 327 may be provided. The two balance cylinders 327 are symmetrically disposed on two sides of the servo motor 324. Movable ends of the balance cylinders 327 are connected to the movable plate 323 to counteract partial or total weight of the movable plate 323 and the probe mechanism 33, so as to reduce load of the servo motor 324, thereby improving the stability of the battery test apparatus, prolonging the service life of the servo motor 324, and in turn improving the reliability of the battery test apparatus.

It should be understood that specific structure and composition of the lifting mechanism 32 may include but are not limited to those shown in FIG. 3.

In some embodiments of this application, the probe mechanism 33 includes an adapting rack 332 and a plurality of first probes 331 disposed on the adapting rack 332. The adapting rack 332 is detachably connected to the lifting mechanism 32.

The probe mechanism 33 is detachably connected to the lifting mechanism 32 via the adapting rack 332. When the size of the battery cells changes and distance between the probes 331 needs to be adjusted, the adapting rack 332 and the lifting mechanism 32 can be separated first, and the probe mechanism 33 is taken out of the battery test apparatus so that the distance between the probes 331 is adjusted outside the battery test apparatus, reducing the operation difficulty and improving the adjustment efficiency, thereby shortening the time for adjusting the distance between the probes 331. As a result, the battery test apparatus can quickly adapt to batteries formed by battery cells of different sizes, thereby improving the test efficiency of the battery test apparatus.

In some embodiments, the adapting rack 332 is detachably connected to the lifting mechanism 32 on one side and provided with two opposite first connecting portions 333 on another side; and the plurality of first connecting members 339 are mounted between the two first connecting portions 333.

Figure 4:
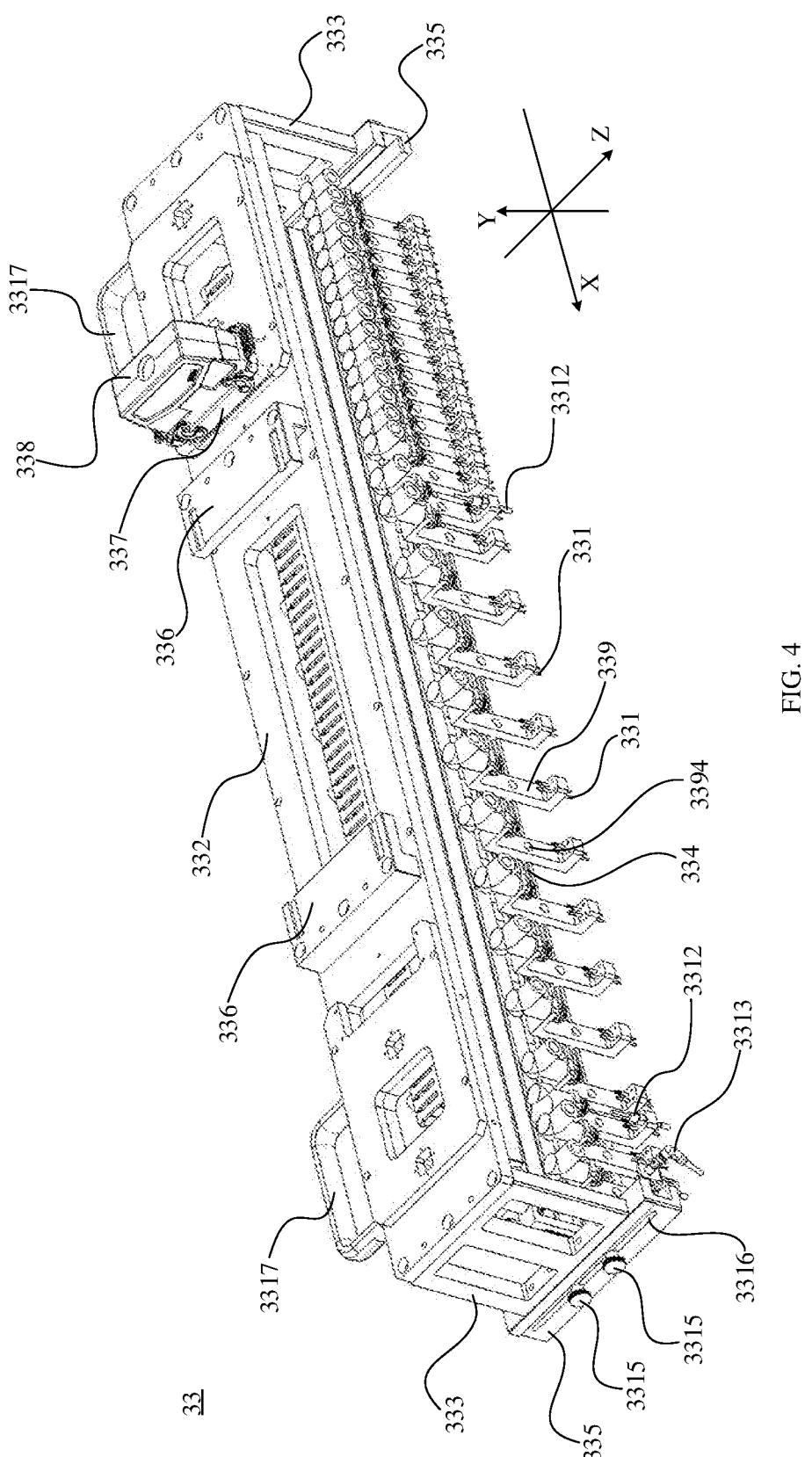
FIG. 4 is a schematic structural diagram of a probe mechanism according to some embodiments of this application.

FIG. 4 is a schematic structural diagram of a probe mechanism according to some embodiments of this application. As shown in FIG. 4, the adapting rack 332 is a strip-shaped plate. The strip-shaped plate is detachably connected to the lifting mechanism 32 on one side, and on another side, is provided with one first connecting portion 333 at one end and the other first connecting portion 333 at the other end in direction X. The first connecting portion 333 is connected to the strip-shaped plate at one end and extends a specified length away from the probe mechanism 33 at the other end.

The two first connecting portions 333 may be located at two ends of the adapting rack 332 respectively or located at positions close to end portions of the adapting rack 332. The first connecting portion 333 may be a connecting plate as shown in FIG. 4. One end of the first connecting portion 333 may be fixedly connected to the adapting rack 332 via a rivet, a screw, or the like, or fixedly connected to the adapting rack 332 in a welding or adhesion manner. Alternatively, the two first connecting portions 333 may be integrally formed with the adapting rack 332.

As shown in FIG. 4, the adapting rack 332 and the two first connecting portions 333 form an accommodating space, on a side facing away from the lifting mechanism 32, for accommodating a plurality of first probes 331. The plurality of first probes 331 may be mounted between the two first connecting portions 333.

It can be understood that the adapting rack 332 and the first connecting portion 333 may each be a hollow plate with a hollow region as shown in FIG. 4, a flat plate with no hollow region, a planar plate, or a curved plate with a certain radian. Specific structures of the adapting rack 332 and the first connecting portion 333 may include but are not limited to the foregoing examples.

In these embodiments of this application, the adapting rack 332 is provided with the two opposite first connecting portions 333, and the plurality of first probes 331 may be mounted between the two first connecting portions 333, so that the entire probe mechanism 33 has a simple structure and a large operation space, allowing an operator to conveniently adjust or maintain the first probes 331 between the two first connecting portions 333.

In some embodiments, the probe mechanism 33 includes a first guide rail 334; two ends of the first guide rail 334 are connected to the two first connecting portions 333 respectively; and the plurality of first probes 331 are mounted to the first guide rail 334.

Figure 5:
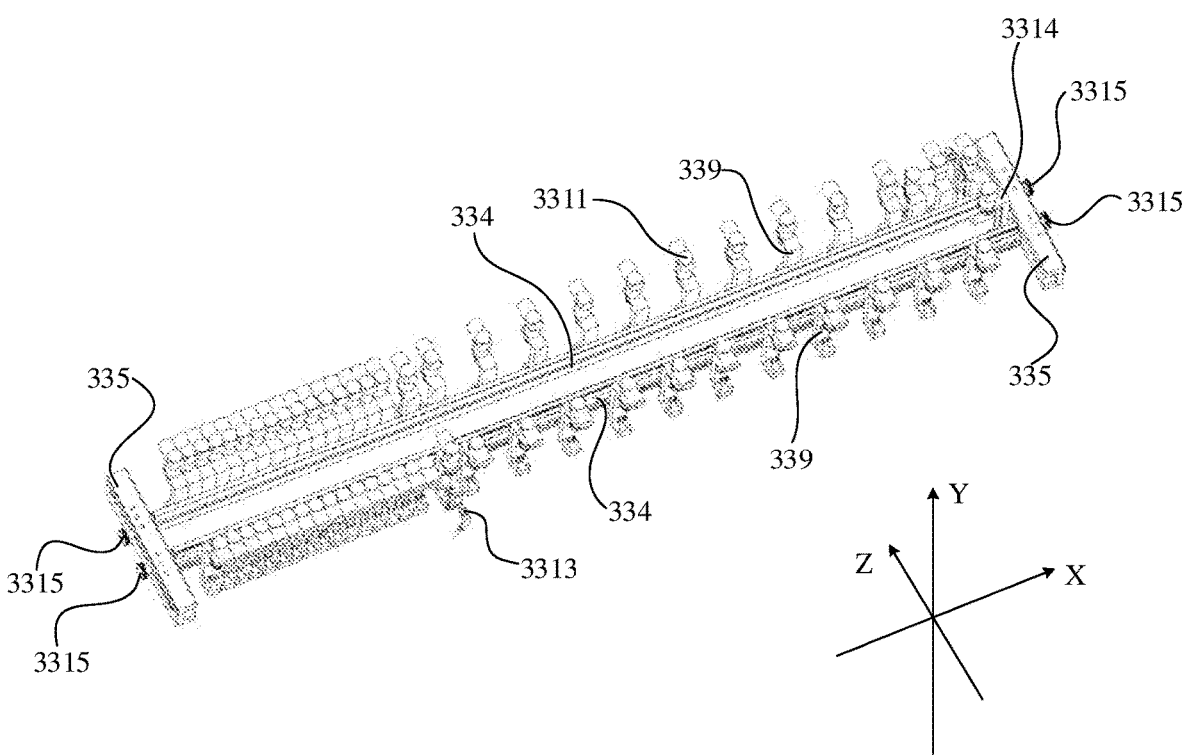
FIG. 5 is a schematic diagram of a partial structure of a probe mechanism according to some embodiments of this application.

FIG. 5 is a schematic diagram of a partial structure of a probe mechanism according to some embodiments of this application. As shown in FIG. 5, the probe mechanism 33 includes two first guide rails 334 arranged in parallel. The first guide rails 334 are disposed in direction X. One end of the first guide rail 334 is connected to one first connecting portion 333, and the other end is connected to the other first connecting portion 333.

The probe mechanism 33 may include one first guide rail 334 or a plurality of first guide rails 334 arranged in parallel. Each first guide rail 334 is equipped with a plurality of first connecting members 339, the first probes 331 may be mounted to the first connecting members 339, and each first connecting member 339 may be equipped with at least one first probe 331.

When the probe mechanism 33 includes one first guide rail 334, one row of first probes 331 on the first guide rail 334 may come into contact with one row of electrode terminals in a battery. When the probe mechanism 33 includes two first guide rails 334, two rows of first probes 331 on the two first guide rails 334 are respectively configured to contact with two rows of electrode terminals in a battery.

The first guide rail 334 may be made of an insulating material with large strength so as to bear the plurality of first connecting members 339, and may be insulated and isolated from the first probes 331 on the first connecting members 339, thereby improving test accuracy.

In these embodiments of this application, the plurality of first probes being mounted to the first guide rail between the two first connecting portions can simplify the structure of the probe mechanism and reduce the weight of the probe mechanism, allowing an operator to conveniently dismount the probe mechanism.

In some embodiments, the probe mechanism 33 includes a plurality of first guide rails 334 arranged in parallel, with an adjustable distance between adjacent two of the first guide rails 334.

As shown in FIG. 4, the probe mechanism 33 includes two first guide rails 334, the two first guide rails 334 are arranged in parallel, and the distance between the two first guide rails 334 is adjustable.

In some embodiments, the first connecting portion 333 is provided with a second guide rail 335, and the first guide rail 334 is slidably connected to the first connecting portion 333 via the second guide rail 335.

As shown in FIG. 4, the second guide rail 335 may be mounted at an end of the first connecting portion 333 away from the adapting rack 332, the second guide rail 335 is disposed in direction Z, and the first guide rail 334 is perpendicular to or approximately perpendicular to the second guide rail 335.

The second guide rail 335 is provided with a second slide way 3316, and an end portion of the first guide rail 334 is located inside the second slide way 3316. In addition, the end portion of the first guide rail 334 is provided with a second fixing member 3315, and the second fixing member 3315 is configured to fix the first guide rail 334 to the second slide way 3316.

For example, the second fixing member 3315 may be a knob, the knob is rotationally connected to the end portion of the first guide rail 334, and distance between the knob and the first guide rail 334 is adjustable. After unscrewed, the knob has a relatively large distance with the first guide rail 334, and the first guide rail 334 can slide in the second slide way 3316, such that a position of the first guide rail 334 on the second guide rail 335 can be adjusted.

On the contrary, after screwed, the knob has a relatively small distance with the first guide rail 334, and the first guide rail 334 can be clamped inside the second slide way 3316, such that the position of the first guide rail 334 on the second guide rail 335 can be fixed.

As shown in FIG. 5, distance between the two first guide rails 334 can be adjusted by adjusting the position of the first guide rail 334 on the second guide rail 335. Two opposite first probes 331 on the two first guide rails 334 are configured to contact with two electrode terminals on the same battery cell respectively. The distance between the two first guide rails 334 being adjustable allows the probe mechanism 33 to adapt to battery cells different in width.

The second guide rail 335 may be fixedly mounted to the first connecting portion 333 via a rivet, a screw, or the like. Alternatively, the second guide rail 335 may be integrally formed with the first connecting portion 333. A specific structure of the second guide rail 335 and connection manners between the second guide rail 335 and the first connecting portion 333 as well as between the second guide rail 335 and the first guide rail 334 include but are not limited to the foregoing examples.

In these embodiments of this application, the probe mechanism includes the second guide rails, and the distance between the first guide rails can be adjusted via the second guide rails, such that the probe mechanism can adapt to battery cells of different sizes, allowing for relatively high compatibility of the battery test apparatus.

In some embodiments, the lifting mechanism 32 is provided with a plurality of first plug-connection members 321 spaced apart along a length direction of the first guide rail 334. The adapting rack 332 is provided with second plug-connection members 336 corresponding to the first plug-connection members 321, and the second plug-connection members 336 are in plug connection with the corresponding first plug-connection members 321.

As shown in FIG. 3, the first plug-connection members 321 may be plug-connection grooves; two first plug-connection members 321 are disposed at the bottom of the movable plate; and the two first plug-connection members 321 are disposed with a certain distance therebetween along direction X. In this way, the two first plug-connection members 321 can be spaced apart along the length direction of the first guide rail 334.

As shown in FIG. 4, two second plug-connection members 336 are provided, apart from each other along the length direction of the first guide rail 334, on a side of the adapting rack 332 facing away from the first guide rail 334. Distance between the two first plug-connection members 321 matches distance between the two second plug-connection members 336. In addition, the first plug-connection members 321 match the second plug-connection members 336 in shape.

The second plug-connection member 336 may be a flat plate-shaped connection plug as shown in FIG. 4; the first plug-connection member 321 may be a U-shaped plug-connection groove as shown in FIG. 3; and the second plug-connection member 336 has a slightly smaller size than the first plug-connection member 321, such that the second plug-connection member 336 can be inserted into the first plug-connection member 321.

As shown in FIG. 2, during mounting of the probe mechanism 33, the probe mechanism 33 can be lifted to an upper portion of the first accommodating space 34 so that the two second plug-connection members 336 respectively face the two first plug-connection members 321, and then the probe mechanism 33 is pushed along direction Z, so that the two second plug-connection members 336 are respectively inserted into the corresponding first plug-connection members 321. In this way, the probe mechanism 33 can be mounted at a movable end of the lifting mechanism 32.

On the contrary, when the probe mechanism 33 needs to be dismounted from the battery test apparatus, the probe mechanism 33 can be pulled along a direction opposite to direction Z; and after the second plug-connection members 336 are separated from the first plug-connection members 321, the probe mechanism 33 can be taken out of the entire battery test apparatus.

As shown in FIG. 4, when the bottom of the lifting mechanism 32 is provided with only two first plug-connection members 321, the two first plug-connection members 321 may be respectively disposed on two sides of the lifting mechanism 32 to improve the stability of the probe mechanism 33.

In actual use, the bottom of the lifting mechanism 32 may alternatively be provided with 3, 4, 5, or another number of first plug-connection members 321 spaced apart along the length direction of the first guide rail 334, and the adapting rack 332 may be provided with the second plug-connection members 336 that respectively correspond to the first plug-connection members 321.

It should be noted that the first plug-connection member 321 may be a U-shaped groove as shown in FIG. 4, a C-shaped plug-connection groove, or a plug-connection member of other shapes, as long as each pair of second plug-connection member 336 and first plug-connection member 321 match each other in shape and position.

In these embodiments of this application, the probe mechanism and the lifting mechanism are detachably connected via plug-connection fit between the second plug-connection members and the first plug-connection members, so that an operator can conveniently dismount and mount the probe mechanism, improving the dismounting and mounting efficiency for the probe mechanism, thereby improving the test efficiency of the battery test apparatus.

In some embodiments, the battery test apparatus further includes support mechanisms 37 parallel to the probe mechanism 33, and the support mechanisms 37 are configured to support the probe mechanism 33 when the probe mechanism 33 is separated from the lifting mechanism 32.

Figure 6:
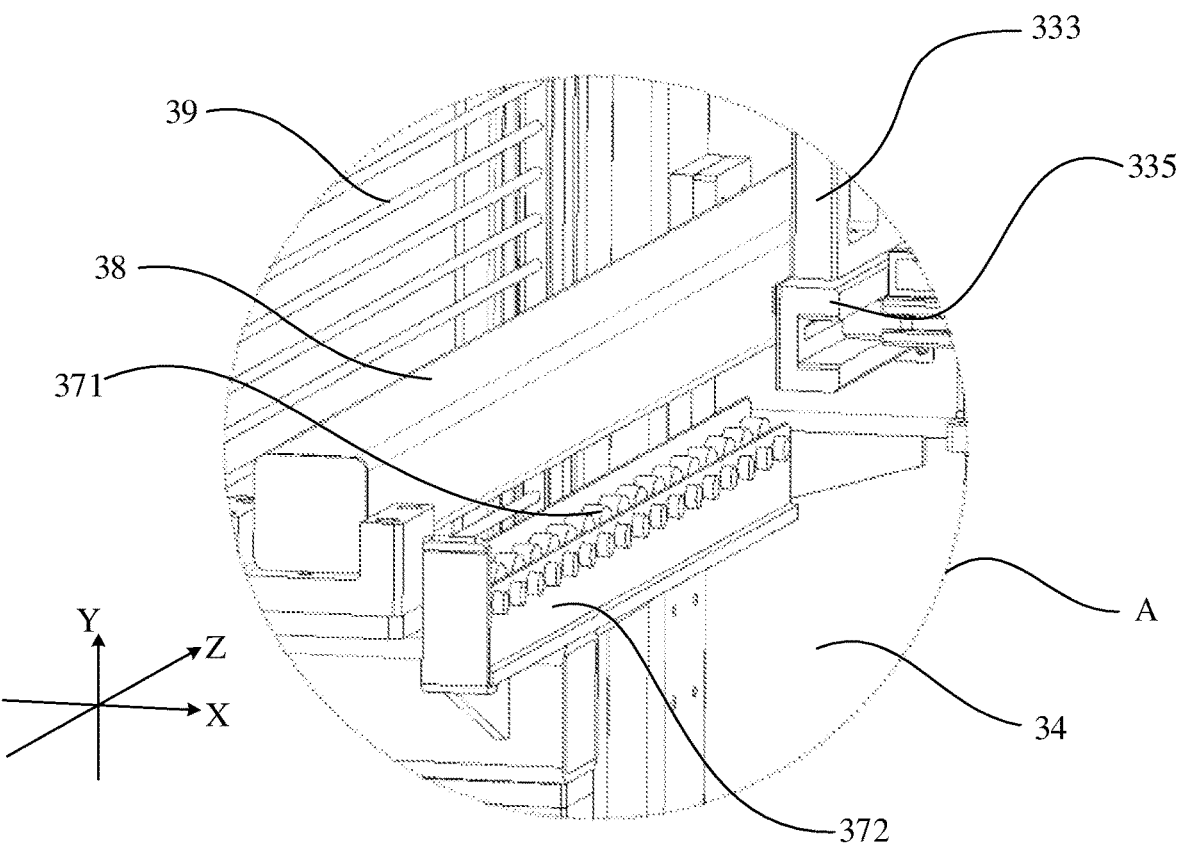
FIG. 6 is an enlarged schematic diagram of area A in FIG. 2.

FIG. 6 is an enlarged schematic diagram of area A in FIG. 2. As shown in FIG. 6, the support mechanism 37 includes a plurality of unpowered rollers 371 and a mounting rail 372. The unpowered rollers 371 are mounted in the mounting rail 372, and the plurality of unpowered rollers can rotate in the mounting rail 372.

As shown in FIG. 2, two support mechanisms 37 are respectively provided on two ends of the probe mechanism 33. The two support mechanisms 37 are located on a side of the probe mechanism 33 in a lifting direction and are arranged parallel to the probe mechanism 33 in the first accommodating space 34. In addition, the first connecting portion 333 corresponds to the unpowered roller 371 at the same end, is located above the unpowered roller 371 in direction Y, and has a certain distance with the unpowered roller 371. When the probe mechanism 33 is separated from the lifting mechanism 32, the first connecting portion 333 may fall onto the corresponding unpowered roller 371.

The adapting rack 332 is provided with a second handle 3317. During dismounting of the probe mechanism 33, the probe mechanism 33 can be pulled along a direction opposite to direction Z via the second handle 3317. When the second plug-connection members 336 leave from the first plug-connection members 321, the two second guide rails 335 may respectively fall onto a corresponding group of support mechanisms 37 and slide on the support mechanisms 37. When the second plug-connection members 336 are totally separated from the first plug-connection members 321, the probe mechanism 33 can be taken down from the two support mechanisms 37 and the probe mechanism 33 is taken out of the first accommodating space 34, thereby completing the dismounting of the probe mechanism 33.

During mounting of the probe mechanism 33, firstly the probe mechanism 33 can be placed on the support mechanisms 37 at two ends, then the probe mechanism 33 is pushed along direction Z, and under the action of the support mechanisms 37, the second plug-connection members 336 can be inserted into the first plug-connection members 321, thereby completing the mounting of the probe mechanism 33.

It should be noted that a specific type of the support mechanisms 37 may include but is not limited to the foregoing example.

In these embodiments of this application, a support member is mounted in the battery test apparatus to reduce the dismounting and mounting difficulty of the probe mechanism and implement quick mounting and dismounting of the probe mechanism, thereby improving the test efficiency of the battery test apparatus.

In some embodiments, the battery test apparatus further includes a safety mechanism. The safety mechanism is a safety grating 39 as shown in FIG. 2. The two ends of the probe mechanism 33 may each be provided with a group of safety gratings 39, and the safety gratings 39 are electrically connected to the controller in the battery test apparatus. After the battery test apparatus is started to operate, when a foreign matter enters the first accommodating space 34 from the two ends of the probe mechanism 33, the safety gratings 39 can send an alarming signal to the controller, and the controller can control the battery test apparatus to be shut down after receiving the alarming signal.

For example, the safety mechanism may further include a safety switch 310, and the safety switch 310 is disposed on a frame 31 and electrically connected to the controller. During operation of the battery test apparatus, when the safety switch 310 is in a turn-on state, a turn-on signal may be sent to the controller. After receiving the turn-on signal, the controller controls the battery test apparatus to operate normally.

During maintenance of the battery test apparatus, an operator can manually turn off the safety switch 310, the safety switch 310 may send a turn-off signal to the controller, and after receiving the turnoff signal, the controller controls the battery test apparatus to be shut down and prohibits the start and operation of the battery test apparatus.

With the mounting switch 310 provided, the operator can manually shut down the battery test apparatus conveniently during the maintenance of the battery test apparatus, reducing the possibility of mistaken start of the battery test apparatus during the maintenance and effectively protecting the operator, thereby improving the safety and reliability of the battery test apparatus.

For example, the safety mechanism may include a safety component formed by a safety cross beam 38 and a switch element (not shown in the figure) located at the bottom of the safety cross beam 38, and the switch element is electrically connected to the controller. During operation of the battery test apparatus, the safety cross beam 38 is placed on the switch element, so that the switch element is turned on, the switch element sends a turn-on signal to the controller, and the controller controls the battery test apparatus to operate normally.

During maintenance of the battery test apparatus, the operator can take down the safety cross beam 38 from the switch element, such that the switch element is turned off and sends a turn-off signal to the controller. After receiving the turn-off signal, the controller controls the battery test apparatus to be shut down and prohibits the start and operation of the battery test apparatus.

With the safety cross beam 38 and the switch element, the operator can manually shut down the battery test apparatus conveniently during the maintenance of the battery test apparatus, reducing the possibility of mistaken start of the battery test apparatus during the maintenance and effectively protecting the operator, thereby improving the safety and reliability of the battery test apparatus.

It should be understood that a specific type of the safety mechanism may be configured as required, and may include but is not limited to the foregoing example.

In some embodiments, the first plug-connection member 321 is provided with a first fixing member 3212, and the first fixing member 3212 is configured to fix the second plug-connection member 336 to the first plug-connection member 321.

Figure 7:
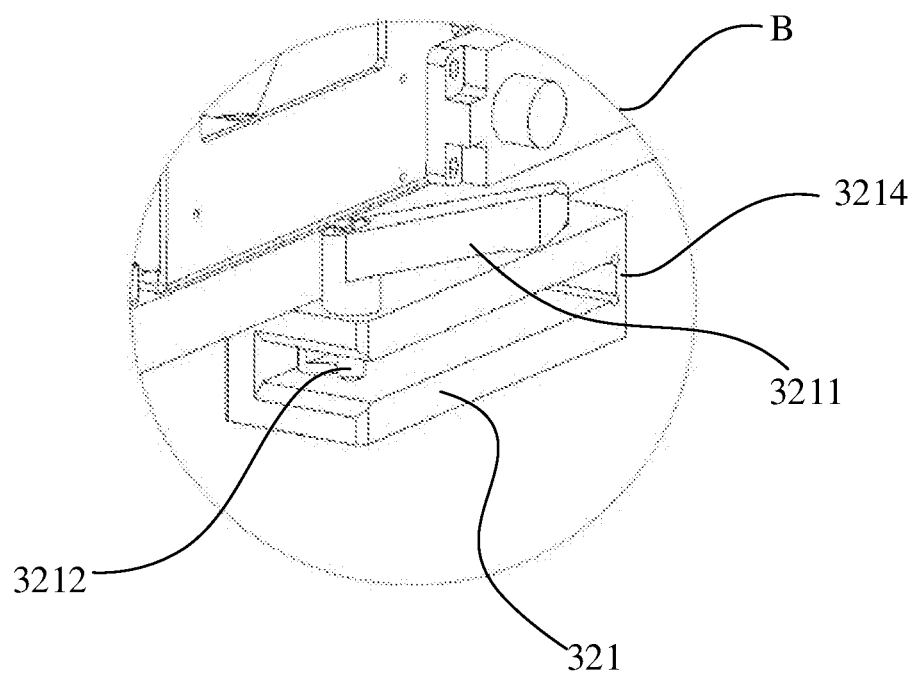
FIG. 7 is an enlarged schematic diagram of area B in FIG. 3.

FIG. 7 is an enlarged schematic diagram of area B in FIG. 3. As shown in FIG. 7, the first fixing member 3212 may be, for example, a cylindrical pin. Pin holes are formed in corresponding positions of the first plug-connection member 321 and the second plug-connection member 336. One end of the cylindrical pin is connected to a first handle 3211, and the other end extends toward the second plug-connection member 336 and is inserted into the pin hole of the second plug-connection member 336.

Before the probe mechanism 33 is mounted, the cylindrical pin can be pulled out of the first plug-connection member 321 via the first handle 3211, then the second plug-connection member 336 is inserted into the first plug-connection member 321, and after the second plug-connection member 336 is aligned to the pin hole of the first plug-connection member 321, the cylindrical pin can be inserted into the pin holes of the second plug-connection member 336 and the first plug-connection member 321 via the first handle 3211, such that the second plug-connection member 336 is fixed within the first plug-connection member 321, and thus the probe mechanism 33 is fixed to the bottom of the lifting mechanism 32.

In these embodiments of this application, the first plug-connection member is provided with the fixing member, and the fixing member is capable of fixing the second plug-connection member such that the probe mechanism is stably mounted to the lifting mechanism, improving the stability of the probe mechanism, thereby improving the accuracy of a test result.

In some embodiments, the first plug-connection member 321 may be provided with a limiting member 3214, and the limiting member can limit an insertion position of the second plug-connection member 336. As shown in FIG. 7, the limiting member 3214 may be a baffle integrally formed with the first plug-connection member 321. While the second plug-connection member 336 is being inserted into the first plug-connection member 321, the baffle can limit the insertion position of the second plug-connection member 336, allowing the operator to conveniently and quickly mount the probe mechanism 33 to the bottom of the lifting mechanism 32.

In some embodiments, the first plug-connection member 321 is provided with a first in-place detection sensor 3213, and the first in-place detection sensor 3213 is configured to detect whether the second plug-connection member 336 is inserted in place.

Figure 8:
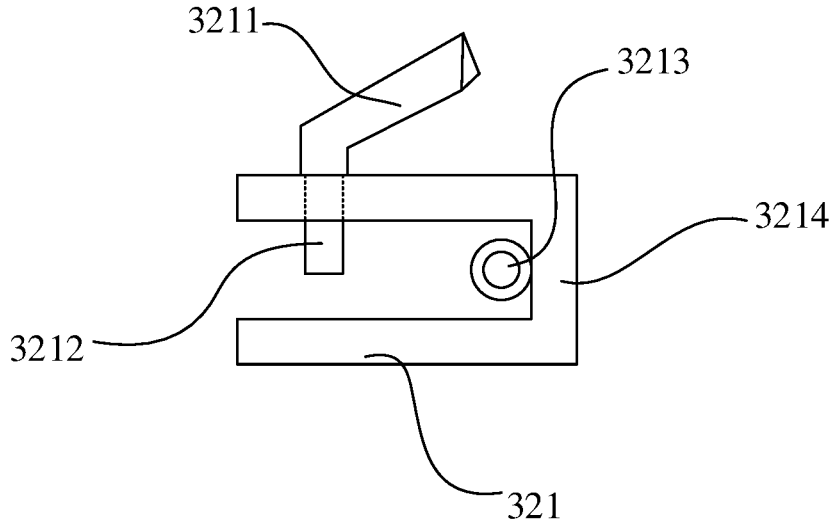
FIG. 8 is a side view of a first plug-connection member according to some embodiments of this application.

FIG. 8 is a side view of a first plug-connection member according to some embodiments of this application. As shown in FIG. 8, the first in-place detection sensor 3213 is disposed in the first plug-connection member 321. The first in-place detection sensor 3213 may be an approach switch, and the approach switch is electrically connected to the controller. After the second plug-connection member 336 has been inserted into the corresponding first plug-connection member 321 in place, the approach switch can be triggered to be turned on, and the approach switch can send a turn-on signal to the controller. On the contrary, after the second plug-connection member 336 has been taken out of the first plug-connection member 321 or the second plug-connection member 336 has not been inserted in place, the approach switch is in a turn-off state, and the approach switch can send a turn-off signal to the controller.

After receiving the turn-on signal, the controller can determine that the second plug-connection member 336 has been inserted in place and can start the test for the battery. After receiving the turn-off signal, the controller can determine that the second plug-connection member 336 has not been inserted in place and can prohibit the start and operation of the battery test apparatus.

It can be understood that the first in-place detection sensor can include but is not limited to the approach switch in the foregoing example.

In these embodiments of this application, the first plug-connection member is provided with the in-place detection sensor, allowing the battery test apparatus to conveniently acquire a mounting state of the probe mechanism and effectively test a battery according to the mounting state of the probe mechanism.

In some embodiments, the probe mechanism 33 further includes a first electrical connector 337 and a second electrical connector 338. The plurality of first probes 331 are electrically connected to the first electrical connector 337, the second electrical connector 338 is electrically connected to a circuit in the battery test apparatus, and the first electrical connector 337 is electrically connected to the second electrical connector 338.

As shown in FIG. 4, the first electrical connector 337 may be a socket of a Harting connector, the second electrical connector 338 may be a plug of a Harting connector, and the socket and the plug are in plug-connection fit with each other to form a Harting connector. The socket may be fixedly mounted on a side of the adapting rack 332 facing away from the first guide rail 334, and the plug is inserted into the socket.

The first probe 331 on each first connecting member 339 is electrically connected to one wiring terminal in the socket via a wire. The wiring terminal on the plug is electrically connected to a relay in the circuit. When the plug is inserted into the socket, the first probe 331 can be connected to the circuit.

It should be noted that the first electrical connector 337 and the second electrical connector 338 may alternatively be other types of electrical connectors, and may include but are not limited to Harting connectors.

Since the first electrical connector 337 and the second electrical connector 338 are separable, when the probe mechanism 33 needs to be taken out of the battery test apparatus, the first electrical connector 337 and the second electrical connector 338 can be separated first to break the electrical connection between the probe mechanism 33 and the circuit, and then the probe mechanism 33 is taken out of the battery test apparatus.

On the contrary, during mounting of the probe mechanism 33, the probe mechanism 33 may be mounted in the battery test apparatus first, and then the second electrical connector 338 is inserted into the first electrical connector 337, thereby quickly establishing the electrical connection between the probe mechanism 33 and the circuit.

As shown in FIG. 3, the lifting mechanism 32 is provided with a wiring mechanism. The wiring mechanism is, for example, a tank chain 328. The tank chain 328 is configured for arrangement of connecting wires between the second electrical connector 338 and the circuit. The lifting mechanism 32 may be provided with a plurality of tank chains 328, such that the connecting wires with different voltage grades are respectively arranged in different tank chains.

In these embodiments of this application, with plug-connection fit between the first electrical connector and the second electrical connector, the probe mechanism and the battery test apparatus can be electrically connected or disconnected quickly, thereby significantly shortening the time for dismounting and mounting the probe mechanism.

In some embodiments, the plurality of first connecting members 339 are detachably connected to the first guide rail 334; the first connecting member 339 is provided with a first joint 3310; the first joint 3310 is electrically connected to the first probe 331 mounted to the first connecting member 339; the battery test apparatus includes second joints 3311 corresponding to the first joints 3310; the second joints 3311 are detachably connected to the corresponding first joints 3310; and the second joints 3311 are electrically connected to the circuit in the battery test apparatus.

Figure 9:
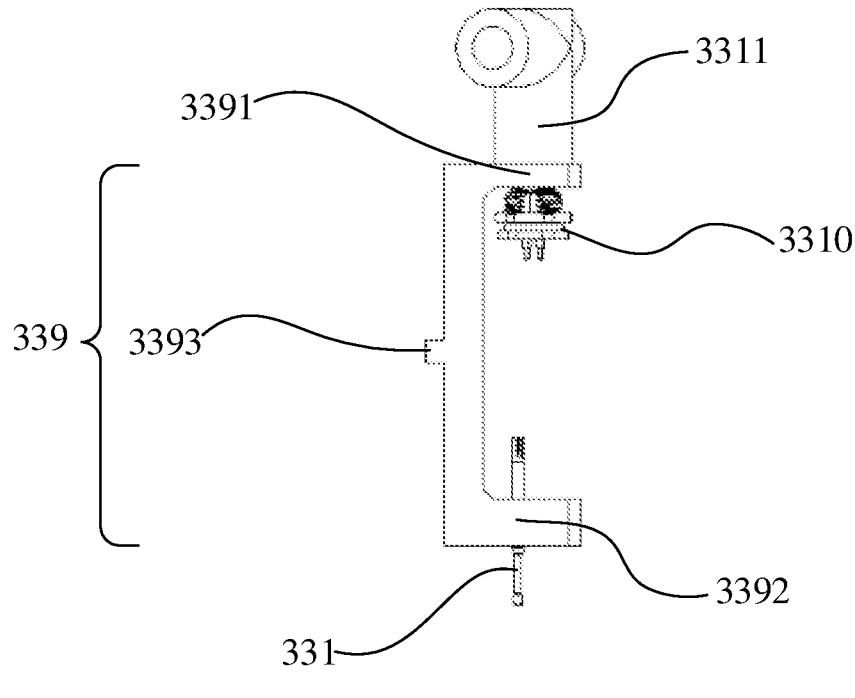
FIG. 9 is a side view of a first connecting member according to some embodiments of this application.

FIG. 9 is a side view of a first connecting member according to some embodiments of this application. As shown in FIG. 9, the first connecting member 339 may be a strip-shaped connecting block and includes a first bent portion 3391 located at one end of the first connecting member 339 and a second bent portion 3392 located at the other end. The first bent portion 3391 and the second bent portion 3392 are located on a same side of the first connecting member 339.

The first joint 3310 is disposed on a side of the first bent portion 3391 close to the second bent portion 3392, and the second joint 3311 is disposed on a side of the first bent portion 3391 away from the second bent portion 3392. The first bent portion 3391 is provided with a through hole. The first joint 3310 is detachably connected to the second joint 3311 after passing through the through hole, and is electrically connected to the second joint 3311. The second bent portion 3392 is provided with a plurality of first probes 331, for example, 2, 3, or 4 first probes 331.

In actual use, a wire may be provided between the first probe 331 and the first joint 3310. One end of the wire is welded to the first probe 331 and the other end is welded to the first joint 3310 so as to implement electrical connection between the first probe 331 and the first joint 3310, thereby implementing electrical connection between the first probe 331 and the second joint 3311.

In some embodiments, the first connecting member 339 is provided with a second connecting portion 3393; and the first guide rail 334 is provided with a first slide way 3341 matching the second connecting portion 3394; where the second connecting portion 3393 is slidably connected to the first slide way 3341.

Figure 10:
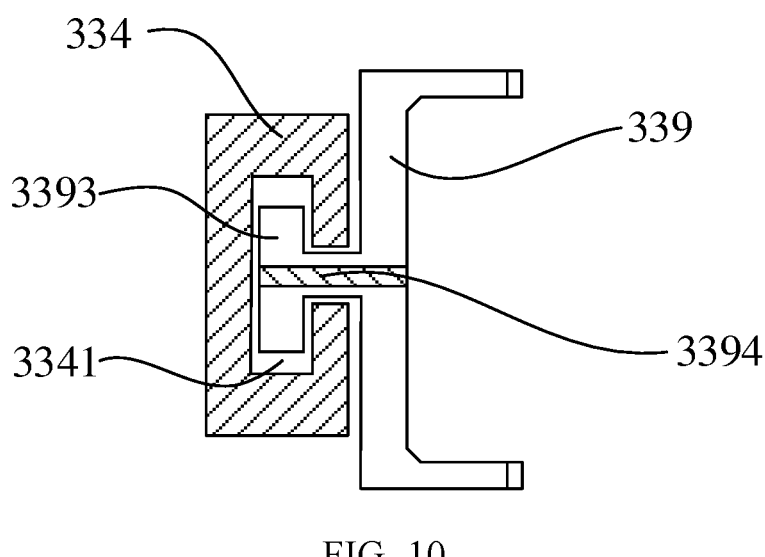
FIG. 10 is a schematic mounting diagram of a first connecting member according to some embodiments of this application.

FIG. 10 is a schematic mounting diagram of a first connecting member according to some embodiments of this application. As shown in FIG. 10, the first connecting member 339 is provided with a second connecting portion 3393; the second connecting portion 3393 is located between the first bent portion 3391 and the second bent portion 3392; and the second connecting portion 3393 is provided with a screw hole 3394. The first guide rail 334 is provided with a first slide way 3341 matching the second connecting portion 3393 in shape and size; the second connecting portion 3393 is located inside the first slide way 3341; and the second connecting portion 3393 can drive the first connecting member 339 to slide inside the first slide way 3341.

After the first connecting member 339 is mounted to the first guide rail 334, a screw may be provided in the screw hole 3394. The screw abuts against a side wall of the first slide way 3341 so as to fix the first connecting member 339 to the first guide rail 334.

When the first connecting member 339 has a fault, for example, when the first probe 331 on the first connecting member 339 is damaged and cannot be used normally, the first joint 3310 and the second joint 3311 on the first connecting member 339 may be separated first, and then the first connecting member 339 having the fault is taken down from the first guide rail 334. Then, a normal first connecting member 339 may be mounted to the first guide rail 334, and a corresponding second joint 3311 is connected to the first joint 3310, such that the first connecting member 339 having the fault in the probe mechanism 33 can be quickly replaced.

When the probe mechanism is provided with a first electrical connector 337 and a second electrical connector 338, the first probe 331 may be connected to the first electrical connector 337 via the first joint 3310 and the second joint 3311 that are electrically connected, so as to be electrically connected to the circuit via the first electrical connector 337 and the second electrical connector 338 that are in plug-connection fit with each other.

It should be understood that the first connecting member and the first guide rail may alternatively be detachably connected in other manners, and a specific detachable connection manner may include but is not limited to the foregoing example.

In these embodiments, the first connecting member is adjustable in position on the first guide rail, allowing an operator to conveniently adjust distance between two adjacent first connecting members on the first guide rail, such that the probe mechanism can adapt to battery cells different in thickness, thereby improving the compatibility of the battery test apparatus.

In these embodiments of this application, the first connecting member is detachably connected to the first guide rail, and the first probe and the circuit are electrically connected via the first joint and the second joint that are detachably connected, such that in case of a fault occurring in the first connecting member, the first connecting member with the fault can be quickly replaced, allowing an operator to conveniently maintain the probe mechanism.

In some embodiments, at least some of the first connecting members 339 are provided with a temperature sensor 3312, and the temperature sensor 3312 is configured to detect temperature of a battery cell.

Figure 11:
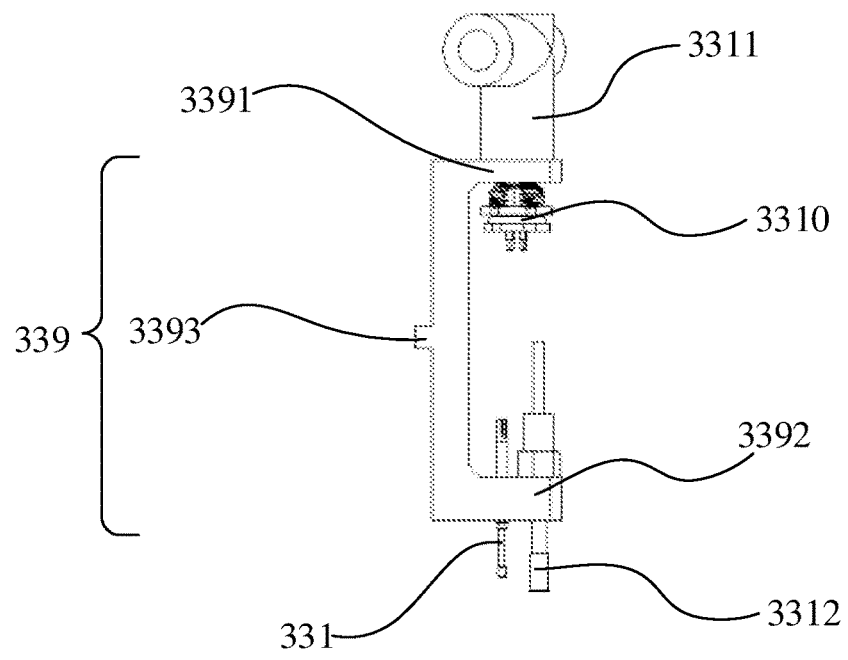
FIG. 11 is a side view of another first connecting member according to some embodiments of this application.

FIG. 11 is a side view of another first connecting member according to some embodiments of this application. As shown in FIG. 11, in addition to the first probe 331, the first connecting member 339 is further provided with a temperature sensor 3312. The temperature sensor 3312 may be a temperature probe.

The first joint 3310 and the second joint 3311 may each be provided with a plurality of wiring terminals. The first probe 331 may be electrically connected to the first electrical connector 337 via one pair of wiring terminals. The temperature probe may be electrically connected to the first electrical connector 337 via another pair of wiring terminals. Then, the first probe 331 may be electrically connected to the circuit via the first electrical connector 337 and the second electrical connector 338 that are in plug-connection fit with each other. The temperature probe may be electrically connected to the controller via the first electrical connector 337 and the second electrical connector 338 that are in plug-connection fit with each other.

During a test for a battery, the temperature probe may come into contact with an electrode terminal of the battery to sample temperature of a battery cell and send a sampled temperature value to the controller. A specific type of the temperature sensor may include but is not limited to the foregoing example.

It should be noted that the probe mechanism includes a plurality of first connecting members. Some of the plurality of first connecting members are provided with a temperature sensor. A plurality of temperature sensors may be disposed on the plurality of first connecting members at different positions, allowing for convenient temperature detection for the battery cells at different positions in the battery.

In these embodiments of this application, some of the first connecting members are provided with a temperature sensor, and the temperature of the battery cells in the battery can be detected using the temperature sensors, allowing for convenient temperature detection for characteristic points of the battery during a battery test.

In some embodiments, at least some of the first connecting members 339 are provided with a second in-place detection sensor 3313, and the second in-place detection sensor 3313 is configured to detect whether the probe mechanism 33 has moved to a target position.

Figure 12:
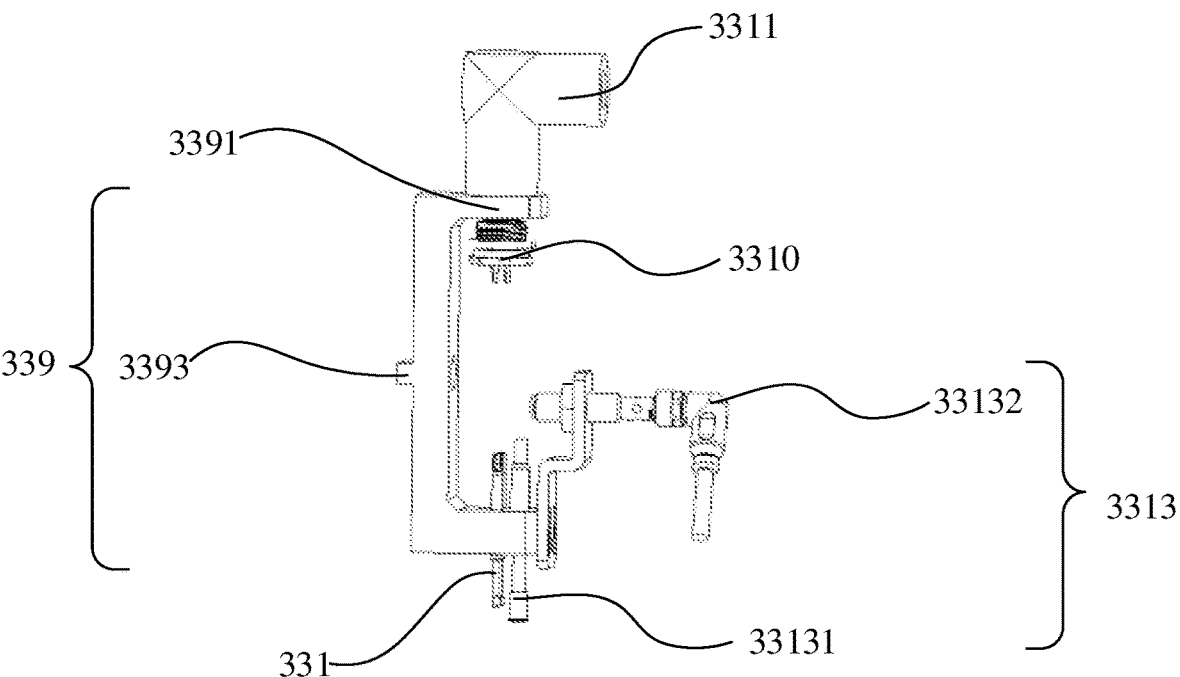
FIG. 12 is a side view of another first connecting member according to some embodiments of this application.

FIG. 12 is a side view of another first connecting member according to some embodiments of this application. As shown in FIG. 12, in addition to the first probe 331, the first connecting member 339 is further provided with a second in-place detection sensor 3313. The second in-place detection sensor 3313 may be, for example, an approach switch including a trigger probe 33131 and a sensing component 33132. The trigger probe 33131 and the first probe 331 are arranged in parallel.

The sensing component 33132 may be electrically connected to the first electrical connector 337 via one pair of wiring terminals in the first joint 3310 and the second joint 3311 and is then electrically connected to the controller via the first electrical connector 337 and the second electrical connector 338 that are in plug-connection fit with each other.

The target position may be a position where the probe mechanism 33 stops in a descending process. After the probe mechanism 33 has moved to the target position, the first probe 331 comes into effective contact with the electrode terminal in the battery without damaging the first probe 331. The target position may be flexible configured according to actual requirements.

While the lifting mechanism 32 is driving the probe mechanism 33 to move, after the probe mechanism 33 has moved to the target position, the trigger probe 33131 comes into contact with the battery cell, such that the trigger probe 33131 moves close to the first joint 3310 to trigger the sensing component 33132 to send a stop signal to the controller, and the controller controls the lifting mechanism 32 to stop running after receiving the stop signal.

It should be noted that the probe mechanism includes a plurality of first connecting members 339. Some of the plurality of first connecting members 339 are provided with a second in-place detection sensor 3313. A plurality of second in-place detection sensors 3313 may be disposed on the plurality of first connecting members 339 at different positions.

In these embodiments of this application, some of the first connecting members are provided with the in-place detection sensor, and the position of the probe mechanism can be detected using the in-place detection sensors, reducing possibility of hard contact between the probe mechanism and the battery, thereby effectively protecting the probe mechanism.

In some embodiments, the probe mechanism 33 further includes a second connecting member 3314 mounted to the first connecting portion 333, and a second probe 3319 on the second connecting member 3314 is configured to contact with an end plate of the battery.

Figure 13:
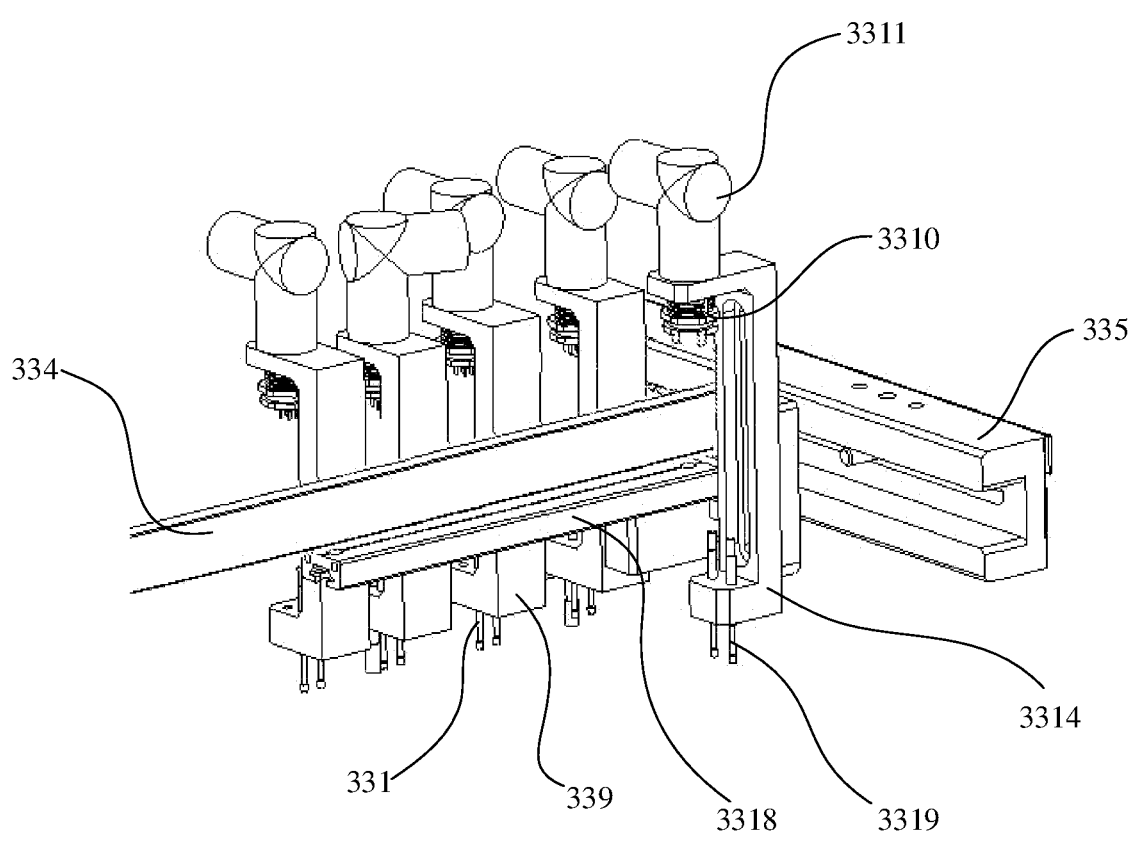
FIG. 13 is a schematic partial diagram of a probe mechanism according to some embodiments of this application.

FIG. 13 is a schematic partial diagram of a probe mechanism according to some embodiments of this application. As shown in FIG. 13, the probe mechanism 33 further includes a second connecting member 3314. The second connecting member 3314 is located between two first guide rails 334, and the second connecting member 3314 is mounted on a side of a second guide rail 335 close to the first guide rails 334 via a structural member 3318.

The second connecting member 3314 and the first connecting member 339 may be connecting members having a same structure. The second connecting member 3314 is provided with one or more second probes 3319. The second connecting member 3314 and the first connecting member 339 are located at a same or approximate height. During a test, after the probe mechanism 33 has moved to the target position, the second probe 3319 may come into contact with the end plate of the battery.

Similarly, the second connecting member 3314 is provided with a first joint 3310 and a second joint 3311 that are detachably connected. The second probe 3319 may be first connected to the first electrical connector 337 via the first joint 3310 and the second joint 3311 that are electrically connected, and is then electrically connected to the circuit via the first connector 337 and the second connector 338 that are in plug-insertion fit with each other.

One of the first connecting portions 333 may be provided with a second connecting member 3314. Alternatively, the two first connecting portions 333 are provided with two second connecting members 3314 respectively. A specific connection manner between the first connecting portion 333 and the second connecting member 3314 may include but is not limited to that described the foregoing example.

During a battery test, the controller may use a circuit to connect the battery cells in the battery in series, and then the battery cells connected in series and the end plate are respectively connected to two ends of the universal meter to perform an insulation test on the battery.

In these embodiments of this application, when the probe mechanism includes the second probe, the battery test apparatus can perform an insulation test on the battery, expanding the application range of the battery test apparatus.

The foregoing descriptions are merely specific embodiments of this application but are not intended to limit the protection scope of this application. Any variation or replacement readily figured out by persons skilled in the art within the technical scope disclosed in this application shall fall within the protection scope of this application. Therefore, the protection scope of this application shall be subject to the protection scope of the claims.

What is claimed is:

1. A battery test apparatus, comprising a lifting mechanism and a probe mechanism; wherein:

the lifting mechanism is configured to drive the probe mechanism to move;

the probe mechanism comprises:

a first guide rail;

an adapting rack detachably connected to the lifting mechanism; and a plurality of first probes disposed on the adapting rack;

the lifting mechanism is provided with a plurality of first plug-connection members spaced apart along a length direction of the first guide rail;

the adapting rack is provided with second plug-connection members corresponding to the first plug-connection members, and the second plug-connection members are in plug connection with the corresponding first plug-connection members;

the adapting rack is detachably connected to the lifting mechanism on one side and is provided with two opposite first connecting portions on another side; and two ends of the first guide rail are connected to the two first connecting portions respectively; and the plurality of first probes are mounted between the two first connecting portions and mounted to the first guide rail.

2. The battery test apparatus according to claim 1, wherein the probe mechanism comprises a plurality of first guide rails arranged in parallel, with an adjustable distance between adjacent two of the first guide rails.

3. The battery test apparatus according to claim 1, wherein the first connecting portion is provided with a second guide rail, and the first guide rail is slidably connected to the first connecting portion via the second guide rail.

4. The battery test apparatus according to claim 1, wherein:

the probe mechanism further comprises a plurality of first connecting members; and the plurality of first probes are mounted to the first guide rail via the plurality of connecting members.

5. The battery test apparatus according to claim 4, wherein:

the first connecting member is provided with a second connecting portion;

the first guide rail is provided with a first slide way matching the second connecting portion; and the second connecting portion is slidably connected to the first slide way.

6. The battery test apparatus according to claim 4, wherein:

the plurality of first connecting members are detachably connected to the first guide rail; and the first connecting member is provided with a first joint, and the first joint is electrically connected to the first probe mounted to the first connecting member; and the battery test apparatus further comprising:

second joints corresponding to the first joints, wherein the second joints are detachably connected to the corresponding first joints, and the second joints are electrically connected to a circuit in the battery test apparatus.

7. The battery test apparatus according to claim 4, wherein at least one or more of the first connecting members are provided with a temperature sensor configured to detect temperature of a battery cell.

8. The battery test apparatus according to claim 4, wherein at least one or more of the first connecting members are provided with a second in-place detection sensor configured to detect whether the probe mechanism has moved to a target position.

9. The battery test apparatus according to claim 1, wherein the first plug-connection member is provided with a first in-place detection sensor, and the first in-place detection sensor is configured to detect whether the second plug-connection member is inserted in place.

10. The battery test apparatus according to claim 1, wherein the first plug-connection member is provided with a first fixing member, and the first fixing member is configured to fix the second plug-connection member to the corresponding first plug-connection member.

11. The battery test apparatus according to claim 1, wherein:

the probe mechanism further comprises a first electrical connector and a second electrical connector; and the plurality of first probes are electrically connected to the first electrical connector, the second electrical connector is electrically connected to a circuit in the battery test apparatus, and the first electrical connector is electrically connected to the second electrical connector.

12. The battery test apparatus according to claim 1, wherein the probe mechanism further comprises a second connecting member mounted to the first connecting portion, and a second probe on the second connecting member is configured to contact with an end plate of the battery.

13. The battery test apparatus according to claim 1, further comprising:

support mechanisms parallel to the probe mechanism, wherein the support mechanisms are configured to support the probe mechanism when the probe mechanism is separated from the lifting mechanism.

14. The battery test apparatus according to claim 1, wherein the adapting rack is a strip-shaped plate.

* * * * *